(12) United States Patent
Zhang et al.

(10) Patent No.: US 12,087,746 B2
(45) Date of Patent: Sep. 10, 2024

(54) MICROELECTRONIC ASSEMBLIES HAVING AN INTEGRATED CAPACITOR

(71) Applicant: Intel Corporation, Santa Clara, CA (US)

(72) Inventors: Chong Zhang, Chandler, AZ (US); Cheng Xu, Chandler, AZ (US); Junnan Zhao, Chandler, AZ (US); Ying Wang, Chandler, AZ (US); Meizi Jiao, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/128,952

(22) Filed: Mar. 30, 2023

(65) Prior Publication Data

US 2023/0238368 A1 Jul. 27, 2023

Related U.S. Application Data

(63) Continuation of application No. 16/234,302, filed on Dec. 27, 2018, now Pat. No. 11,721,677.

(51) Int. Cl.
*H01L 23/52* (2006.01)
*H01L 21/56* (2006.01)
(Continued)

(52) U.S. Cl.
CPC ............ *H01L 25/16* (2013.01); *H01L 21/568* (2013.01); *H01L 23/49811* (2013.01);
(Continued)

(58) Field of Classification Search
CPC . H01L 25/16; H01L 21/568; H01L 23/49811; H01L 23/528; H01L 23/5386; H01L 28/40
See application file for complete search history.

(56) References Cited

U.S. PATENT DOCUMENTS 8,692,368 B2 4/2014 Pan
9,048,112 B2 6/2015 Pan
(Continued)

OTHER PUBLICATIONS

Walton, Mark, "HBM Explained: Can stacked memory give AMD the edge it needs?", Biz & It, retrieved on Dec. 21, 2020, https://arstechnica.com/information-technology/2015/05/the-tech-behind-hbm-why-amds-high-pandwidth-memory-matters/, 5 pages.
(Continued)

*Primary Examiner* — Nicholas J Tobergte
(74) *Attorney, Agent, or Firm* — Schwabe, Williamson & Wyatt P.C.

(57) ABSTRACT

Microelectronic assemblies, related devices, and methods are disclosed herein. In some embodiments, a microelectronic assembly may include a die having a first surface and an opposing second surface; a capacitor having a surface, wherein the surface of the capacitor is coupled to the first surface of the die; and a conductive pillar coupled to the first surface of the die. In some embodiments, a microelectronic assembly may include a capacitor in a first dielectric layer; a conductive pillar in the first dielectric layer; a first die having a surface in the first dielectric layer; and a second die having a surface in a second dielectric layer, wherein the second dielectric layer is on the first dielectric layer, and wherein the surface of the second die is coupled to the capacitor, to the surface of the first die, and to the conductive pillar.

20 Claims, 6 Drawing Sheets

(51) Int. Cl.
  *H01L 23/498*   (2006.01)
  *H01L 23/528*   (2006.01)
  *H01L 23/538*   (2006.01)
  *H01L 25/16*    (2023.01)
  *H01L 49/02*    (2006.01)

(52) U.S. Cl.
  CPC ........ *H01L 23/528* (2013.01); *H01L 23/5386* (2013.01); *H01L 28/40* (2013.01); *H01L 2224/1623* (2013.01); *H01L 2224/16265* (2013.01)

(56) References Cited

U.S. PATENT DOCUMENTS

| | | | |
|---|---|---|---|
| 9,129,817 | B2 | 9/2015 | Elsherbini |
| 9,202,803 | B2 | 12/2015 | Zhang |
| 9,269,887 | B1 | 2/2016 | Juskey |
| 9,337,138 | B1 | 5/2016 | Abugharbieh |
| 9,478,474 | B2 * | 10/2016 | Chen .............. H01L 23/3128 |
| 9,773,757 | B2 | 9/2017 | Yu |
| 10,020,262 | B2 | 7/2018 | Alur |
| 10,615,133 | B2 | 4/2020 | Kamgaing |
| 10,950,568 | B2 | 3/2021 | Wirz |
| 2003/0209808 | A1 | 11/2003 | Baba |
| 2007/0152313 | A1 * | 7/2007 | Periaman ......... H01L 25/0657 257/E25.013 |
| 2010/0230806 | A1 | 9/2010 | Huang |
| 2011/0037157 | A1 | 2/2011 | Shin |
| 2011/0050334 | A1 | 3/2011 | Pan |
| 2011/0062549 | A1 | 3/2011 | Lin |
| 2014/0117552 | A1 | 5/2014 | Qian |
| 2014/0124949 | A1 | 5/2014 | Paek |
| 2014/0185264 | A1 | 7/2014 | Chen |
| 2014/0203457 | A1 * | 7/2014 | Kim .............. H01L 25/0657 257/778 |
| 2014/0217547 | A1 | 8/2014 | Elsherbini |
| 2014/0362425 | A1 | 12/2014 | Stephens |
| 2015/0221714 | A1 | 8/2015 | Gu |
| 2016/0276307 | A1 | 9/2016 | Lin |
| 2016/0343635 | A1 | 11/2016 | Rae |
| 2017/0092412 | A1 | 3/2017 | Manusharow |
| 2018/0182699 | A1 * | 6/2018 | Lai .............. H01L 23/5383 |
| 2018/0190635 | A1 | 7/2018 | Choi |
| 2018/0286812 | A1 | 10/2018 | Jain |
| 2018/0331042 | A1 | 11/2018 | Manusharow |
| 2019/0312019 | A1 | 10/2019 | Pietambaram |
| 2019/0356294 | A1 | 11/2019 | Park |
| 2019/0393297 | A1 | 12/2019 | Kung |
| 2020/0006251 | A1 | 1/2020 | Chen |
| 2020/0144186 | A1 | 5/2020 | Thomas |
| 2020/0243448 | A1 | 7/2020 | Qian |
| 2020/0273801 | A1 * | 8/2020 | Kim .............. H01L 23/5385 |
| 2020/0364600 | A1 | 11/2020 | Elsherbini |
| 2020/0395300 | A1 | 12/2020 | Xie |
| 2021/0020574 | A1 | 1/2021 | Yu |
| 2021/0175176 | A1 | 6/2021 | Ji |

OTHER PUBLICATIONS

Office Action for U.S. Appl. No. 17/129,269 mailed Mar. 25, 2022, 16 pgs.

Notice of Allowance and Fees for U.S. Appl. No. 17/129,269 mailed Sep. 28, 2022, 8 pgs.

* cited by examiner

MICROELECTRONIC ASSEMBLIES HAVING AN INTEGRATED CAPACITOR

CROSS-REFERENCE TO RELATED APPLICATIONS

This application is a continuation of U.S. patent application Ser. No. 16/234,302, filed Dec. 27, 2018, the entire contents of which is hereby incorporated by reference herein.

BACKGROUND

Integrated circuit (IC) packages may include capacitors for managing power delivery to IC dies. Typically, IC packages may include capacitors surface-mounted on a backside of a die or on a land side of a circuit board.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
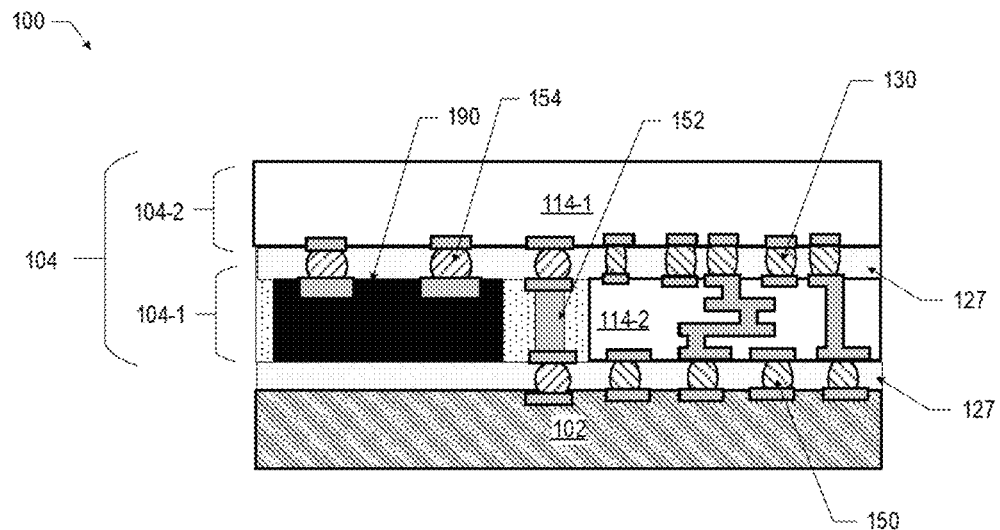
FIG. 1 is a side, cross-sectional view of an example microelectronic assembly, in accordance with various embodiments.

Microelectronic assemblies, and related devices and methods, are disclosed herein. For example, in some embodiments, a microelectronic assembly may include a capacitor in a first dielectric layer; a conductive pillar in the first dielectric layer; a first die having a surface in the first dielectric layer; and a second die having a surface in a second dielectric layer, wherein the second dielectric layer is on the first dielectric layer, and wherein the surface of the second die is coupled to the capacitor, to the surface of the first die, and to the conductive pillar.

Communicating large numbers of signals between two or more dies in a multi-die IC package is challenging due to the increasingly small size of such dies, thermal constraints, and power delivery constraints, among others. Typically, IC packages include prefabricated capacitors that may be surface-mounted on a die or a circuit board. For example, IC packages may include die side capacitors (DSC) mounted on a backside of a die or land side capacitors (LSC) mounted on a circuit board. Surface-mounted capacitors are likely to increase latency of power delivery due to increased power trace distance, occupy limited surface area on the die and/or circuit board, and increase overall z-height (e.g., thickness) of the IC package. Various ones of the embodiments disclosed herein may help achieve improved power efficiency with greater design flexibility, relative to conventional approaches. Various ones of the microelectronic assemblies disclosed herein may exhibit better power delivery while reducing the size of the package relative to conventional approaches. The microelectronic assemblies disclosed herein may be particularly advantageous for small and low-profile applications in computers, tablets, industrial robots, and consumer electronics (e.g., wearable devices).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" means "electrically insulating," unless otherwise specified. Throughout the specification, and in the claims, the term "coupled" means a direct connection, such as a direct electrical, mechanical, or magnetic connection between the things that are connected, or an indirect connection, through one or more passive or active intermediary devices. The meaning of "a," "an," and "the" include plural references. The meaning of "in" includes "in" and "on."

When used to describe a range of dimensions, the phrase "between X and Y" represents a range that includes X and Y. For convenience, the phrase "FIG. 5" may be used to refer to the collection of drawings of FIGS. 5A-5E, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1 is a side, cross-sectional view of a microelectronic assembly 100, in accordance with various embodiments. The microelectronic assembly 100 may include a package substrate 102 coupled to a multi-layer die subassembly 104. As shown in FIG. 1, the multi-layer die subassembly 104 may include two layers 104-1, 104-2. In particular, the multi-layer die subassembly 104 may include a capacitor 190 in a first layer 104-1, and a die 114-1 in a second layer 104-2. In some embodiments, the multi-layer die subassembly 104 may further include a conductive pillar 152, and a die 114-2 in the first layer 104-1. As used herein, the term a "multi-layer die subassembly" 104 may refer to a composite die having two or more stacked layers with one or more dies in each layer, and conductive interconnects and/or conductive pathways connecting the one or more dies, including dies in non-adjacent layers.

The capacitor 190 may include any suitable capacitor, including, for example, a prefabricated capacitor component, such as a surface-mounted capacitor (e.g., DSC or LSC). The capacitor may include any suitable type of capacitor, including a ceramic capacitor, an electrolytic capacitor, a plastic film capacitor, a tantalum capacitor, a silver mica capacitor, and a super capacitor, among others. The capacitor may have any suitable dimensions. In some embodiments, an area (e.g., x-y dimension) of the capacitor is between 10 squared millimeters and 50 squared millimeters. In some embodiments, a thickness (e.g., z-height) of the capacitor is between 10 microns (um) and 100 um. In some embodiments, as shown in FIG. 1, the capacitor 190 may be disposed below the die 114-1 and the footprint of the capacitor 190 may be wholly within the footprint of the die 114-1. In some embodiments, the capacitor 190 may be disposed below the die 114-1 and the footprint of the capacitor 190 may overlap with the footprint of the die 114-1. In some embodiments, the capacitor 190 may be disposed above the die 114-1 (not shown) and coupled to the top surface of the die 114-1, for example, when the die 114-1 is a double-sided die having conductive contacts on a top surface. In this context, a double-sided die refers to a die that has connections on both surfaces. In some embodiments, a double-sided die may include through silicon vias (TSVs) to form connections on both surfaces. The active surface of a double-sided die, which is the surface containing one or more active devices and a majority of interconnects, may face either direction depending on the design and electrical requirements.

The multi-layer die subassembly 104 may include multiple interconnects. In particular, the capacitor 190 may be coupled to the die 114-1 via capacitor-to-die (CTD) interconnects 154, the die 114-1 may be coupled to the package substrate via the conductive pillar 152, the die 114-1 may be coupled to the die 114-2 via die-to-die (DTD) interconnects 130, and the die 114-2 may be coupled to the package substrate 102 via die-to-package substrate (DTPS) interconnects 150. As used herein, a conductive pillar may form an interconnect between a first component and a second component where the first component and the second component are not in adjacent layers, and may interconnect components that span more than one layer (e.g., an interconnect between a first die in a first layer and a second die in a third layer, or an interconnect between a package substrate and a die in a second layer). The conductive pillar 152 may be for routing power or high speed signals. In some embodiments, the conductive pillar 152 may be coupled to a power source (e.g., a power plane or a power trace). In some embodiments, the conductive pillar 152 may be coupled to a ground source (e.g., ground plane). In some embodiments, the conductive pillar 152 may be coupled to a signal trace.

The conductive pillar 152 may be formed of any suitable conductive material, such as copper, silver, nickel, gold, aluminum, or other metals or alloys, for example. The conductive pillar 152 may be formed using any suitable process, including, for example, a lithographical process as described below with reference to FIG. 5. The conductive pillar 152 may improve the performance of the microelectronic assembly 100 by more efficiently delivering power to the die 114-1. In some embodiments, the microelectronic assembly 100 may include a plurality of conductive pillars 152 coupled to one or more dies 114. The conductive pillars 152 may have any suitable size and shape. In some embodiments, the conductive pillars 152 may have a circular, rectangular, or other shaped cross-section.

The CTD interconnects 154 disclosed herein may take any suitable form. In some embodiments, the CTD interconnects 154 may include solder. In some embodiments, the CTD interconnects 154 may include an anisotropic conductive material, such as any of the materials discussed above. In some embodiments, the CTD interconnects 154 may be used for power and ground lines, among others. In some embodiments, some or all of the CTD interconnects 154 in a microelectronic assembly 100 may be metal-to-metal interconnects (e.g., copper-to-copper interconnects, or plated interconnects). In some embodiments, the CTD interconnects 154 may take the same form as the DTD interconnects 130.

The DTD interconnects 130 disclosed herein may take any suitable form. The DTD interconnects 130 may have a finer pitch than the DTPS interconnects 150 in a microelectronic assembly. In some embodiments, the dies 114 on either side of a set of DTD interconnects 130 may be unpackaged dies, and/or the DTD interconnects 130 may include small conductive bumps (e.g., copper bumps) attached by solder. The DTD interconnects 130 may have too fine a pitch to couple to the package substrate 102 directly (e.g., too fine to serve as DTPS interconnects 150). In some embodiments, a set of DTD interconnects 130 may include solder. In some embodiments, a set of DTD interconnects 130 may include an anisotropic conductive material, such as any of the materials discussed above. In some embodiments, the DTD interconnects 130 may be used as data transfer lanes, while the DTPS interconnects 150 may be used for power and ground lines, among others. In some embodiments, some or all of the DTD interconnects 130 in a microelectronic assembly 100 may be metal-to-metal interconnects (e.g., copper-to-copper interconnects, or plated interconnects). In such embodiments, the DTD interconnect 130 may bond conductive contacts on the surfaces of the dies (e.g., under elevated pressure and/or temperature) without the use of intervening solder or an anisotropic conductive material. Any of the interconnects disclosed herein may include bond pads, solder bumps, conductive posts, or any other suitable conductive contact, for example. In some embodiments, some or all of the DTD interconnects 130 in a microelectronic assembly 100 may be solder interconnects that include a solder with a higher melting point than a solder included in some or all of the DTPS interconnects 150. For example, when the DTD interconnects 130 in a microelectronic assembly 100 are formed before the DTPS interconnects 150 are formed (e.g., as discussed below with reference to FIG. 4), solder-based DTD interconnects 130 may use a higher-temperature solder (e.g., with a melting point above 200 degrees Celsius), while the DTPS interconnects 150 may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

The DTPS interconnects 150 disclosed herein may take any suitable form. In some embodiments, a set of DTPS interconnects 150 may include solder (e.g., solder bumps or balls that are subject to a thermal reflow to form the DTPS interconnects 150). In some embodiments, a set of DTPS interconnects 150 may include an anisotropic conductive material, such as an anisotropic conductive film or an anisotropic conductive paste. An anisotropic conductive material may include conductive materials dispersed in a non-conductive material.

In the microelectronic assemblies 100 disclosed herein, some or all of the DTPS interconnects 150 may have a larger pitch than some or all of the DTD interconnects 130. DTD interconnects 130 may have a smaller pitch than DTPS interconnects 150 due to the greater similarity of materials in the different dies 114 on either side of a set of DTD interconnects 130 than between the die 114 and the package substrate 102 on either side of a set of DTPS interconnects 150. In particular, the differences in the material composition of a die 114 and a package substrate 102 may result in differential expansion and contraction of the die 114 and the package substrate 102 due to heat generated during operation (as well as the heat applied during various manufacturing operations). To mitigate damage caused by this differential expansion and contraction (e.g., cracking, solder bridging, etc.), the DTPS interconnects 150 may be formed larger and farther apart than DTD interconnects 130, which may experience less thermal stress due to the greater material similarity of the pair of dies 114 on either side of the DTD interconnects. In some embodiments, the DTPS interconnects 150 disclosed herein may have a pitch between 80 um and 300 um, while the DTD interconnects 130 disclosed herein may have a pitch between 7 um and 100 um.

In some embodiments, the package substrate 102 may be a lower-density medium and the die 114 (e.g., the die 114-2) may be a higher-density medium or have an area with a higher-density medium. As used herein, the term "lower density" and "higher density" are relative terms indicating that the conductive pathways (e.g., including conductive interconnects, conductive lines, and conductive vias) in a lower-density medium are larger and/or have a greater pitch than the conductive pathways in a higher-density medium. In some embodiments, a higher-density medium may be manufactured using a modified semi-additive process or a semi-additive build-up process with advanced lithography (with small vertical interconnect features formed by advanced laser or lithography processes), while a lower-density medium may be a printed circuit board (PCB) manufactured using a standard PCB process (e.g., a standard subtractive process using etch chemistry to remove areas of unwanted copper, and with coarse vertical interconnect features formed by a standard laser process). In other embodiments, the higher-density medium may be manufactured using semiconductor fabrication process, such as a single damascene process or a dual damascene process.

Although FIG. 1 shows the die 114-1 as a single-sided die and the die 114-2 as a double-sided die, the dies 114 may be a single-sided or a double-sided die and may be a single-pitch die or a mixed-pitch die. As used herein, a mixed-pitch die refers to a die having a different pitch on a same surface, or a different pitch on different surfaces (e.g., a first pitch on a bottom surface and a second pitch on a top surface, where the second pitch is different from the first pitch). In some embodiments, additional components may be disposed on the top surface of the die 114-1. Additional passive components, such as surface-mounted resistors, capacitors, and/or inductors, may be disposed on the top surface or the bottom surface of the package substrate 102, or embedded in the package substrate 102.

Figure 2:
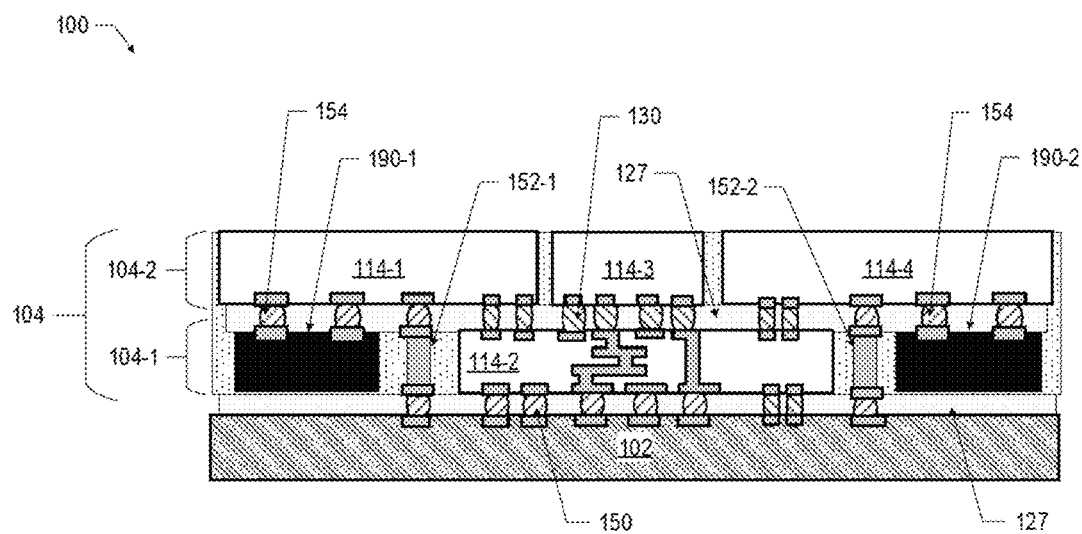
FIG. 2 is a side, cross-sectional view of an example microelectronic assembly, in accordance with various embodiments.
Figure 3:
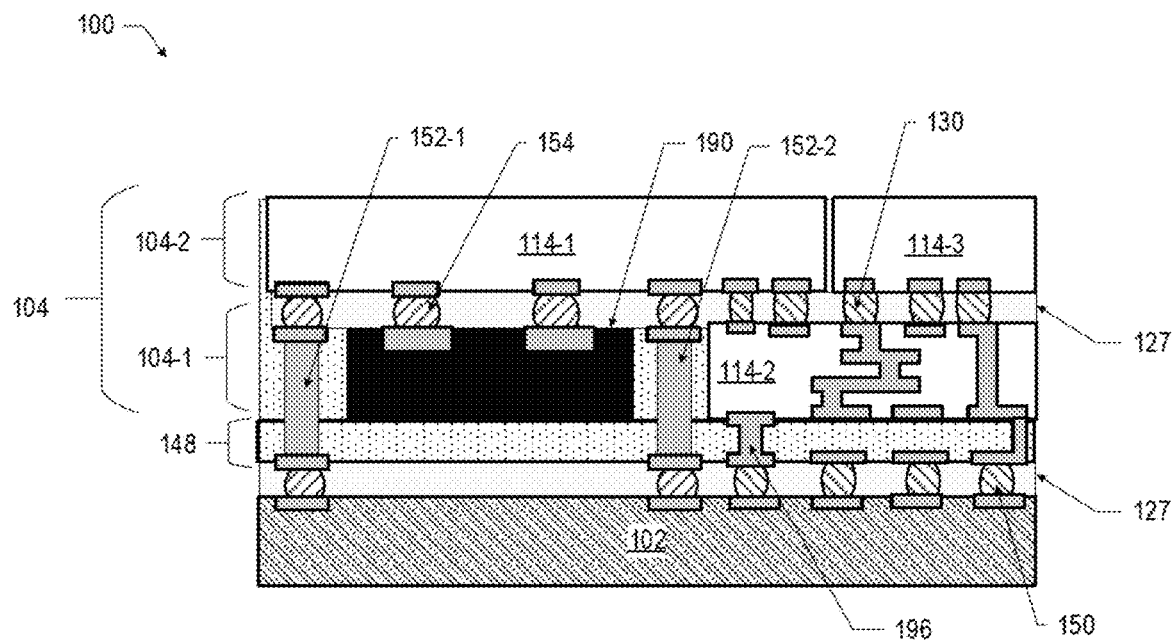
FIG. 3 is a side, cross-sectional view of an example microelectronic assembly, in accordance with various embodiments.
Figure 4:
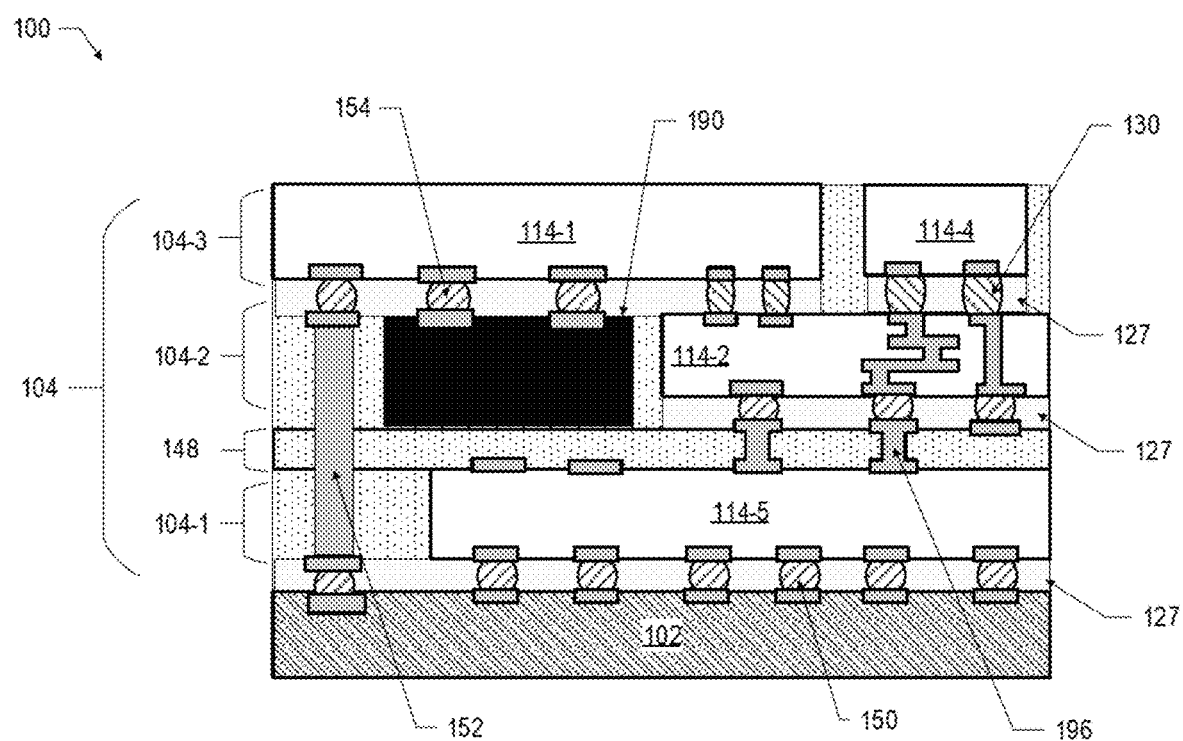
FIG. 4 is a side, cross-sectional view of an example microelectronic assembly, in accordance with various embodiments.

Although FIG. 1 shows one capacitor 190, one conductive pillar 152, and two dies 114 in a particular arrangement, the microelectronic assembly 100 may have any suitable number of capacitors 190, conductive pillars 152, and dies 114 in any suitable arrangement, including exemplary arrangements as shown in FIGS. 2-4.

The microelectronic assembly 100 of FIG. 1 may also include a circuit board (not shown). The package substrate 102 may be coupled to the circuit board by second-level interconnects at the bottom surface of the package substrate 102. The second-level interconnects may be any suitable second-level interconnects, including solder balls for a ball grid array arrangement, pins in a pin grid array arrangement or lands in a land grid array arrangement. The circuit board may be a motherboard, for example, and may have other components attached to it. The circuit board may include conductive pathways and other conductive contacts for routing power, ground, and signals through the circuit board, as known in the art. In some embodiments, the second-level interconnects may not couple the package substrate 102 to a circuit board, but may instead couple the package substrate 102 to another IC package, an interposer, or any other suitable component. In some embodiments, the multi-layer die subassembly may not be coupled to a package substrate 102, but may instead be coupled to a circuit board, such as a PCB.

The microelectronic assembly 100 of FIG. 1 may also include an underfill material 127. In some embodiments, the underfill material 127 may extend between the die 114-1 and the die 114-2, between the die 114-1 and the capacitor 190, and/or between the package substrate 102 and the capacitor 190 and/or the die 114-2. In some embodiments, the underfill material 127 may extend around the associated DTPS interconnects 150. In some embodiments, the underfill material 127 may extend around the associated CTD interconnects 154 and DTD interconnects 130. The underfill material 127 may be an insulating material, such as an appropriate epoxy material. In some embodiments, the underfill material 127 may include a capillary underfill, non-conductive film (NCF), or molded underfill. In some embodiments, the underfill material 127 may include an epoxy flux that assists with soldering the die 114-2 to the package substrate 102 when forming the DTPS interconnects 150, and then polymerizes and encapsulates the DTPS interconnects 150. The underfill material 127 may be selected to have a coefficient of thermal expansion (CTE) that may mitigate or minimize the stress between the dies 114, and the package substrate 102 arising from uneven thermal expansion in the microelectronic assembly 100. In some embodiments, the CTE of the underfill material 127 may have a value that is intermediate to the CTE of the package substrate 102 (e.g., the CTE of the dielectric material of the package substrate 102) and a CTE of the dies 114.

The multi-layer die subassembly 104 may include an insulating material (e.g., a dielectric material formed in multiple layers, as known in the art) to form the multiple layers and to embed one or more dies in a layer. In some embodiments, the insulating material of the multi-layer die subassembly 104 may be a dielectric material, such as an organic dielectric material, a fire retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). The multi-layer die subassembly 104 may include one or more conductive pillars 152 through the dielectric material. The multi-layer die subassembly 104 may have any suitable dimensions. For example, in some embodiments, a thickness of the multi-layer die subassembly 104 may be between 100 um and 2000 um. In some embodiments, the multi-layer die subassembly 104 may be a composite die, such as stacked dies. The multi-layer die subassembly 104 may have any suitable number of layers, any suitable number of dies, and any suitable die arrangement. For example, in some embodiments, the multi-layer die subassembly 104 may have between 3 and 20 layers of dies. In some embodiments, the multi-layer die subassembly 104 may include a layer having between 2 and 10 dies.

The package substrate 102 may include an insulating material (e.g., a dielectric material formed in multiple layers, as known in the art) and one or more conductive pathways to route power, ground, and signals through the dielectric material (e.g., including conductive traces and/or conductive vias, as shown). In some embodiments, the insulating material of the package substrate 102 may be a dielectric material, such as an organic dielectric material, a fire retardant grade 4 material (FR-4), BT resin, polyimide materials, glass reinforced epoxy matrix materials, organic dielectrics with inorganic fillers, or low-k and ultra low-k dielectric (e.g., carbon-doped dielectrics, fluorine-doped dielectrics, porous dielectrics, and organic polymeric dielectrics). In particular, when the package substrate 102 is formed using standard PCB processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable.

The dies 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 9. The conductive pathways in the dies 114 may be bordered by liner materials, such as adhesion liners and/or barrier liners, as suitable.

In some embodiments, the die 114 may include conductive pathways to route power, ground, and/or signals to/from other dies 114 included in the microelectronic assembly 100. For example, the die 114-2 may include TSVs, including a conductive material via, such as a metal via, isolated from the surrounding silicon or other semiconductor material by a barrier oxide, or other conductive pathways through which power, ground, and/or signals may be transmitted between the package substrate 102 and one or more dies 114 "on top" of the die 114-2 (e.g., in the embodiment of FIG. 1, the die 114-1). In some embodiments, the die 114-2 may not route power and/or ground to the die 114-1; instead, the die 114-1 may couple directly to power and/or ground lines in the package substrate 102 by the conductive pillar 152. By allowing the die 114-1 to couple directly to power and/or ground lines in the package substrate 102 via the conductive pillar 152, such power and/or ground lines need not be routed through the die 114-2, allowing the die 114-2 to be made smaller or to include more active circuitry or signal pathways. In some embodiments, the die 114-2 may include conductive pathways and may not contain active or passive circuitry. In other embodiments, the die 114-2 may include active or passive circuitry (e.g., transistors, diodes, resistors, inductors, and capacitors, among others). In some embodiments, the die 114-2 may include one or more device layers including transistors (e.g., as discussed below with reference to FIG. 9). When the die 114-2 includes active circuitry, power and/or ground signals may be routed through the package substrate 102 and to the die 114-2 through the DTPS interconnects 150. In some embodiments, the die 114-2 in the first layer 104-1, also referred to herein as the "base die," may be thicker than the die 114-1 in the second layer 104-2. The die 114-2 of the microelectronic assembly 100 may be a single-sided die (in the sense that the die 114-2 has conductive contacts on a single surface), or, as shown, may be a double-sided die (in the sense that the die 114-2 has conductive contacts on two surfaces (e.g., a top surface and a bottom surface)), and may be a mixed-pitch die (in the sense that the die 114-2 has sets of conductive contacts with different pitches).

The elements of the microelectronic assembly 100 may have any suitable dimensions. In some embodiments, the thickness (e.g., z-height) of the package substrate 102 may be between 0.1 millimeters and 3 millimeters (e.g., between 0.3 millimeters and 2 millimeters, between 0.25 millimeters and 0.8 millimeters, or approximately 1 millimeter).

Many of the elements of the microelectronic assembly 100 of FIG. 1 are included in other ones of the accompanying figures; the discussion of these elements is not repeated when discussing these figures, and any of these elements may take any of the forms disclosed herein. In some embodiments, individual ones of the microelectronic assemblies 100 disclosed herein may serve as a system-in-package (SiP) in which multiple dies 114 having different functionality are included. In such embodiments, the microelectronic assembly 100 may be referred to as an SiP.

FIG. 2 is a side, cross-sectional view of an example microelectronic assembly, in accordance with various embodiments. FIG. 2 illustrates an embodiment of a microelectronic assembly 100 that may include a plurality of capacitors. In particular, a multi-layer die subassembly 104 may include a first capacitor 190-1, a second capacitor 190-2, a first conductive pillar 152-1, a second conductive pillar 152-2, a die 114-2 in a first layer 104-1, and dies 114-1, 114-3, 114-4 in a second layer 104-2. The die 114-1 may be coupled to the first capacitor 190-1 via CTD interconnects 154 and to the die 114-2 via DTD interconnects 130. The first conductive pillar 152-1 may couple the die 114-1 to the package substrate 102. The die 114-4 may be coupled to the second capacitor 190-2 via CTD interconnects 154, and to the die 114-2 via DTD interconnects 130. The second conductive pillar 152-2 may couple the die 114-4 to the package substrate 102. The conductive pillars 152-1 and 152-2 may route power to the dies 114-1 and 114-4, respectively. The die 114-3 may be coupled to the die 114-2 via DTD interconnects 130.

Although FIG. 2 shows a particular arrangement of a microelectronic assembly 100, a microelectronic assembly 100 may include any number and arrangement of capacitors 190, conductive pillars 152, and dies 114. For example, a microelectronic assembly 100 may include two or more capacitors 190. In some embodiments, a microelectronic assembly 100 may include thirty or more capacitors. In some embodiments, a microelectronic assembly may include one hundred or more capacitors.

FIG. 3 is a side, cross-sectional view of another example microelectronic assembly 100, in accordance with various embodiments. In the microelectronic assemblies 100 disclosed herein, the multi-layer die subassembly 104 may include a redistribution layer (RDL) 148, also referred to herein as a package substrate portion. For example, FIG. 3 illustrates an embodiment of a microelectronic assembly 100 in which a multi-layer die subassembly 104 has an RDL 148 below the first layer 104-1. The microelectronic assembly 100 may include a capacitor 190, conductive pillars 152-1 and 152-2 and a die 114-2 in the first layer 104-1, and a die 114-1 and a third die 114-3 in the second layer 104-2. The die 114-2 may be electrically coupled to the package substrate 102 via conductive pathways 196 in the RDL 148. The conductive pillars 152 may extend through the RDL 148 to form interconnects between the die 114-1 and the package substrate 102.

Although FIG. 3 shows a single RDL 148, a multi-layer die subassembly 104 may include more than one RDL 148, and may include any suitable number of RDLs. For example, a multi-layer die subassembly 104 may have a second RDL (not shown) between the first layer 104-1 and the second layer 104-2, and may further include a third RDL (not shown) above the second layer 104-2.

FIG. 4 is a side, cross-sectional view of an example microelectronic assembly 100, in accordance with various embodiments. The microelectronic assembly 100 may include a multi-layer die subassembly 104 having three layers 104-1, 104-2, and 104-3, and may further include an RDL 148 between the first layer 104-1 and the second layer 104-2. In particular, the multi-layer die subassembly 104 may include a die 114-5 in a first layer 104-1, a capacitor 190 and a die 114-2 in a second layer 104-2, and dies 114-1 and 114-4 in a third layer 104-3. The multi-layer die assembly 104 may further include a conductive pillar 152 that extends through multiple layers of the multi-layer die subassembly 104. For example, as shown in FIG. 4, the conductive pillar 152 may extend through the first layer 104-1, the RDL 148, and the second layer 104-2. The conductive pillar 152 may electrically couple the die 114-1 and the package substrate 102. The die 114-1 may be coupled to the capacitor 190 via CTD interconnects 154 and to the die 114-2 via DTD interconnects 130. The die 114-4 may be coupled to the die 114-2 via DTD interconnects 130. The die 114-2 may be coupled to the die 114-5 via a conductive pathway 196 in the RDL 148. The die 114-5 may be coupled to the package substrate 102 via DTPS interconnects 150. As shown in FIG. 4, the capacitor 190 may be disposed in an upper layer (e.g., the second layer 104-2) of the multi-layer die subassembly 104 and coupled to the die 114-1, which is in an adjacent layer (e.g., 104-3). In some embodiments, as shown in FIG. 4, the footprint of the capacitor 190 may be wholly within the footprint of the die 114-1. The conductive pillar 152 may route power to the die 114-1.

FIGS. 5A-5E are side, cross-sectional views of various stages in an example process for manufacturing the microelectronic assembly of FIG. 1, in accordance with various embodiments. Any suitable techniques may be used to manufacture the microelectronic assemblies disclosed herein. Although the operations discussed below with reference to FIGS. 5A-5E are illustrated in a particular order, these operations may be performed in any suitable order. Additionally, although particular assemblies are illustrated in FIGS. 5A-5E, the operations discussed below with reference to FIGS. 5A-5E may be used to form any suitable assemblies.

Figure 5A:
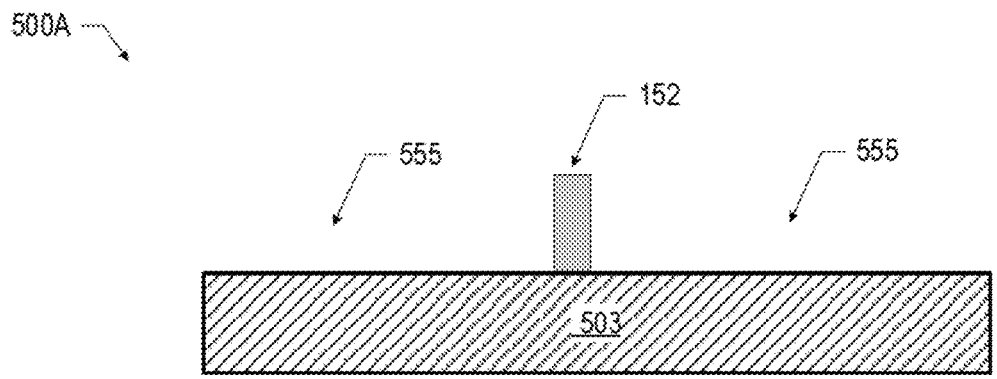
FIGS. 5A-5E are side, cross-sectional views of various stages in an example process for manufacturing the microelectronic assembly of FIG. 1, in accordance with various embodiments.

FIG. 5A illustrates an assembly 500A including a carrier 503 subsequent to forming a conductive pillar 152 on the top surface of the carrier 503. The carrier 503 may include any suitable material for providing mechanical stability during manufacturing operations. The conductive pillar 152 may be disposed to form one or more de-population regions 555 in which no conductive pillars are present. The conductive pillar 152 may take the form of any of the embodiments disclosed herein, and may be formed using any suitable technique, including a lithographic process or an additive process, such as cold spray or 3-dimensional printing. For example, the conductive pillar 152 may be formed by depositing, exposing, and developing a photoresist layer on the top surface of the carrier 503. The photoresist layer may be patterned to form a cavity in the shape of the conductive pillar. Conductive material, such as copper, may be deposited in the openings in the patterned photoresist layer to form the conductive pillar 152. The conductive material may be deposited using any suitable process, such as electroplating, sputtering, or electroless plating. The photoresist may be removed to expose the conductive pillar 152. In another example, a photo-imageable dielectric may be used to form the conductive pillar 152. In some embodiments, a seed layer (not shown) may be formed on the top surface of the carrier 503 prior to depositing the photoresist material and the conductive material. The seed layer may be any suitable conductive material, including copper. The seed layer may be removed, after removing the photoresist layer, using any suitable process, including chemical etching, among others. In some embodiments, the seed layer may be omitted.

Although only one conductive pillar is shown, multiple conductive pillars may be formed using any of the processes disclosed herein.

The conductive pillars may have any suitable dimensions and may span one or more layers. For example, in some embodiments, an individual conductive pillar may have an aspect ratio (height:diameter) between 1:1 and 4:1 (e.g., between 1:1 and 3:1). In some embodiments, an individual conductive pillar may have a diameter (e.g., cross-section) between 10 um and 1000 um. For example, an individual conductive pillar may have a diameter between 50 um and 400 um. In some embodiments, an individual conductive pillar may have a height (e.g., z-height or thickness) between 50 um and 500 um. The conductive pillars may have any suitable cross-sectional shape, such as square, triangular, and oval, among others.

Figure 5B:
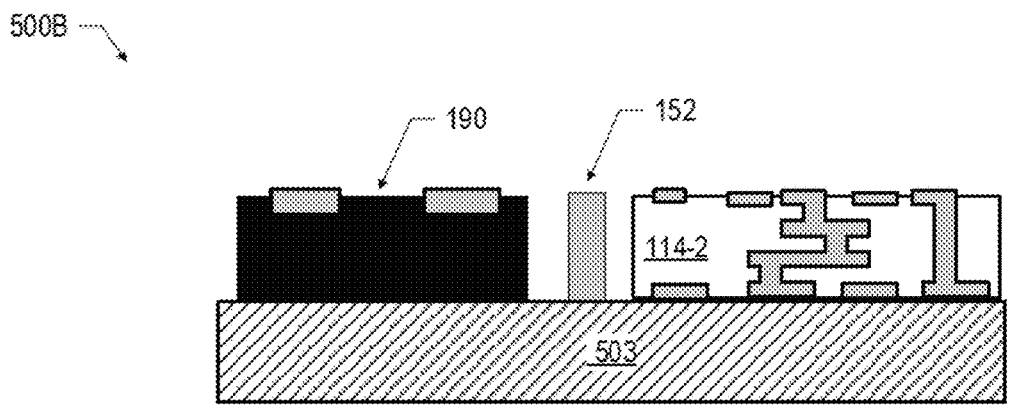

FIG. 5B illustrates an assembly 500B subsequent to placing the capacitor 190 and the die 114-2 in the depopulation regions 555 of the assembly 500A (FIG. 5A). The capacitor 190 and the die 114-2 may be placed on the carrier 503 using any suitable technique, such as using pick and place tooling, and may be attached using any suitable technique, such as die attach film (DAF). The die 114-2 may include a non-electrical material layer (not shown) or a carrier (not shown) on top of the die 114-2 that provides improved mechanical stability. The non-electrical material layer, which is an inactive portion of the die 114-2, may include silicon, ceramic, or quartz, among other materials. The non-electrical material layer may be attached to the die 114-2 using any suitable technique, including, for example, a release layer. The release layer (also referred to herein as a debonding layer) may include a temporary adhesive, or other material that releases when exposed to heat or light, for example. The non-electrical material layer may be removed using any suitable technique, including, for example, grinding, etching (such as reactive ion etching or chemical etching), or, if the debonding layer includes a photo-reactive or thermally-reactive material, applying light or heat. The carrier may include any suitable material to provide mechanical stability. The carrier may be attached to the die 114-2 using any suitable technique, including, for example, a removable adhesive.

Figure 5C:
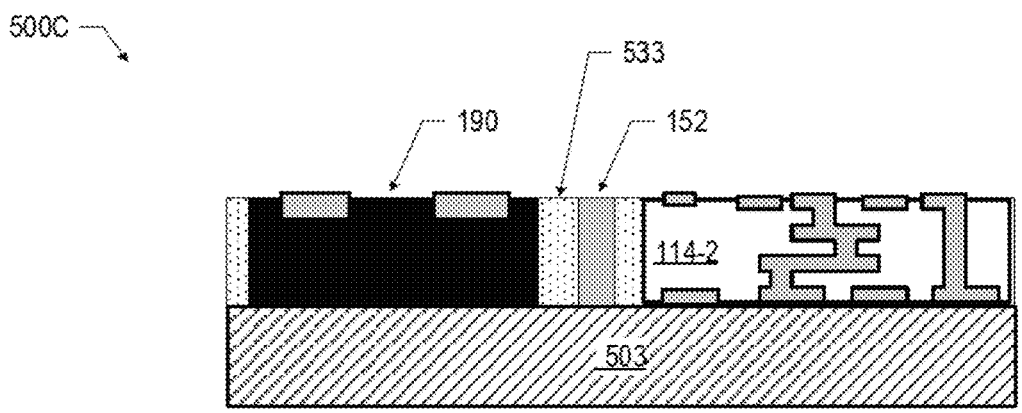

FIG. 5C illustrates an assembly 500C subsequent to providing an insulating material 533 around the capacitor 190, the die 114-2, and the conductive pillar 152. In some embodiments, the insulating material 533 may be initially deposited on and over the tops of the capacitor 190, the die 114-2, and the conductive pillar 152, then polished back to expose the conductive contacts at the top surface of the capacitor 190 and the die 114-2 and the top surface of the conductive pillar 152. In some embodiments, the insulating material 533 is a mold material, such as an organic polymer with inorganic silica particles. In some embodiments, the insulating material 533 is a dielectric material. In some embodiments, the dielectric material may include an organic dielectric material, a fire retardant grade 4 material (FR-4), BT resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). The dielectric material may be formed using any suitable process, including lamination, or slit coating and curing. If the dielectric layer is formed to completely cover the capacitor 190, the die 114-2, and the conductive pillar 152, the dielectric layer may be removed to expose the conductive contacts at the top surface of the capacitor 190 and the die 114-2 and the top surface of the conductive pillar 152 using any suitable technique, including grinding or etching, such as a wet etch, a dry etch (e.g., a plasma etch), a wet blast, or a laser ablation (e.g., using excimer laser). In some embodiments, the thickness of the insulating material 533 may be minimized to reduce the etching time required.

Figure 5D:
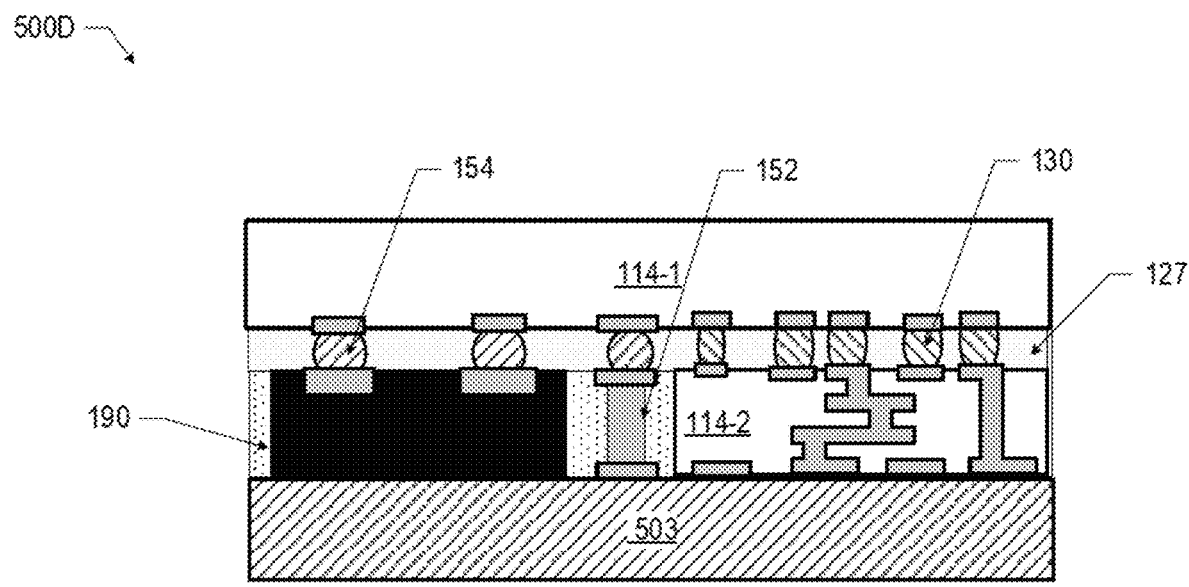

FIG. 5D illustrates an assembly 500D subsequent to placing the die 114-1. The die 114-1 may be placed as described above with reference to die 114-2 in FIG. 5B. The die 114-1 may be coupled to the capacitor 190 by CTD interconnects 154, to the die 114-2 by DTD interconnects 130, and to the conductive pillar 152. In some embodiments, an insulating material may be provided around the die 114-1. In some embodiments, an underfill material 127 may be provide around the CTD interconnects 154 and the DTD interconnects 130. Additional layers of the composite die may be built up by repeating the process as described with respect to FIGS. 5A-5E.

Figure 5E:
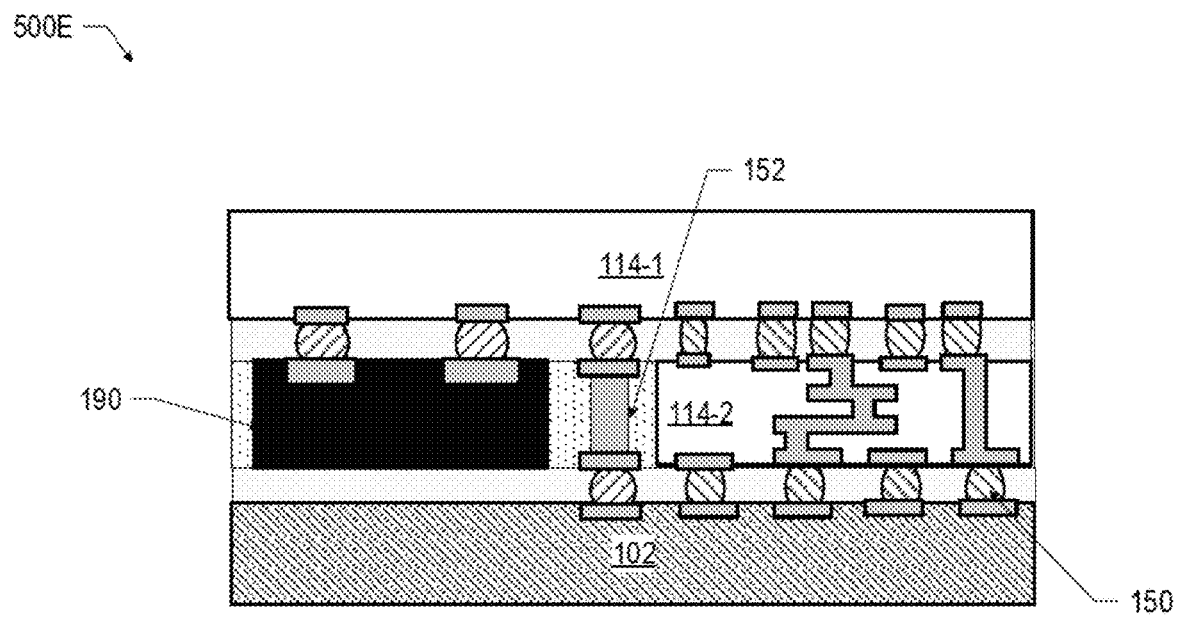

FIG. 5E illustrates an assembly 500E subsequent to removal of the carrier 503 and coupling to a package substrate 102. The conductive pillar 152 may couple the die 114-1 to the package substrate 102, and the die 114-2 may be coupled to the package substrate 102 via DTPS interconnects 150. If multiple composite dies are manufactured together, the composite dies may be singulated after removal of the carrier 503. Further operations may be performed as suitable either before or after singulating (e.g., depositing a mold material, attaching a heat spreader, depositing a solder resist layer, attaching solder balls for coupling to a package substrate or to a circuit board, etc.). Although assembly 500E has conductive contacts on the bottom surface of the die 114-2 and on the bottom surface of the conductive pillar 152 for electrically coupling to a package substrate or a circuit board, in some embodiments, the die 114-1 may include conductive contacts on a top surface such that the assembly may be inverted or "flipped" and coupled to a package substrate or circuit board via interconnects on the top surface of the die 114-1. An RDL (not shown) may be included between any layer and may be manufactured using any suitable technique, such as a PCB technique or a redistribution layer technique.

The microelectronic assemblies 100 disclosed herein may be used for any suitable application. For example, in some embodiments, a microelectronic assembly 100 may be used to provide power to the die 114-1, where the die 114-1 may be a processing device (e.g., a central processing unit (CPU), a graphics processing unit (GPU), a field programmable gate array (FPGA), a modem, an applications processor, etc.). In some embodiments, the die 114-2 may include high bandwidth memory, transceiver circuitry, and/or input/output circuitry (e.g., Double Data Rate transfer circuitry, Peripheral Component Interconnect Express circuitry, etc.). In another example, the die 114-2 in a microelectronic assembly 100 may be a cache memory (e.g., a third-level cache memory), and one or more dies 114-1 and 114-4 may be processing devices (e.g., a CPU, a GPU, a FPGA, a modem, an applications processor, etc.) that share the cache memory of the die 114-2. In another example, a die 114-2 may be a single silicon substrate or may be a composite die, such as a stacked die or an omni-directional interconnect (ODI) die.

The microelectronic assemblies disclosed herein may be included in any suitable electronic component. FIGS. 6-9 illustrate various examples of apparatuses that may include, or be included in, any of the microelectronic assemblies disclosed herein.

Figure 6:
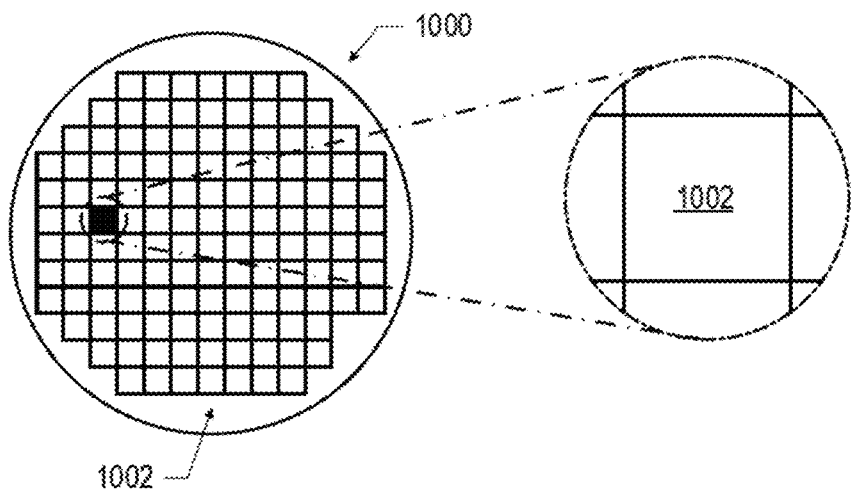
FIG. 6 is a top view of a wafer and dies that may be included in a microelectronic assembly, in accordance with any of the embodiments disclosed herein.

FIG. 6 is a top view of a wafer 1000 and dies 1002 that may be included in any of the microelectronic assemblies disclosed herein (e.g., any of the dies 114 disclosed herein).

The wafer 1000 may be composed of semiconductor material and may include one or more dies 1002 having IC structures formed on a surface of the wafer 1000. Each of the dies 1002 may be a repeating unit of a semiconductor product that includes any suitable IC. After the fabrication of the semiconductor product is complete, the wafer 1000 may undergo a singulation process in which the dies 1002 are separated from one another to provide discrete "chips" of the semiconductor product. The die 1002 may be any of the dies 114 disclosed herein. The die 1002 may include one or more transistors (e.g., some of the transistors 1140 of FIG. 7, discussed below), supporting circuitry to route electrical signals to the transistors, passive components (e.g., signal traces, resistors, capacitors, or inductors), and/or any other IC components. In some embodiments, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processing device (e.g., the processing device 1402 of FIG. 9) or other logic that is configured to store information in the memory devices or execute instructions stored in the memory array. Various ones of the microelectronic assemblies disclosed herein may be manufactured using a die-to-wafer assembly technique in which some dies are attached to a wafer 1000 that includes others of the dies, and the wafer 1000 is subsequently singulated.

Figure 7:
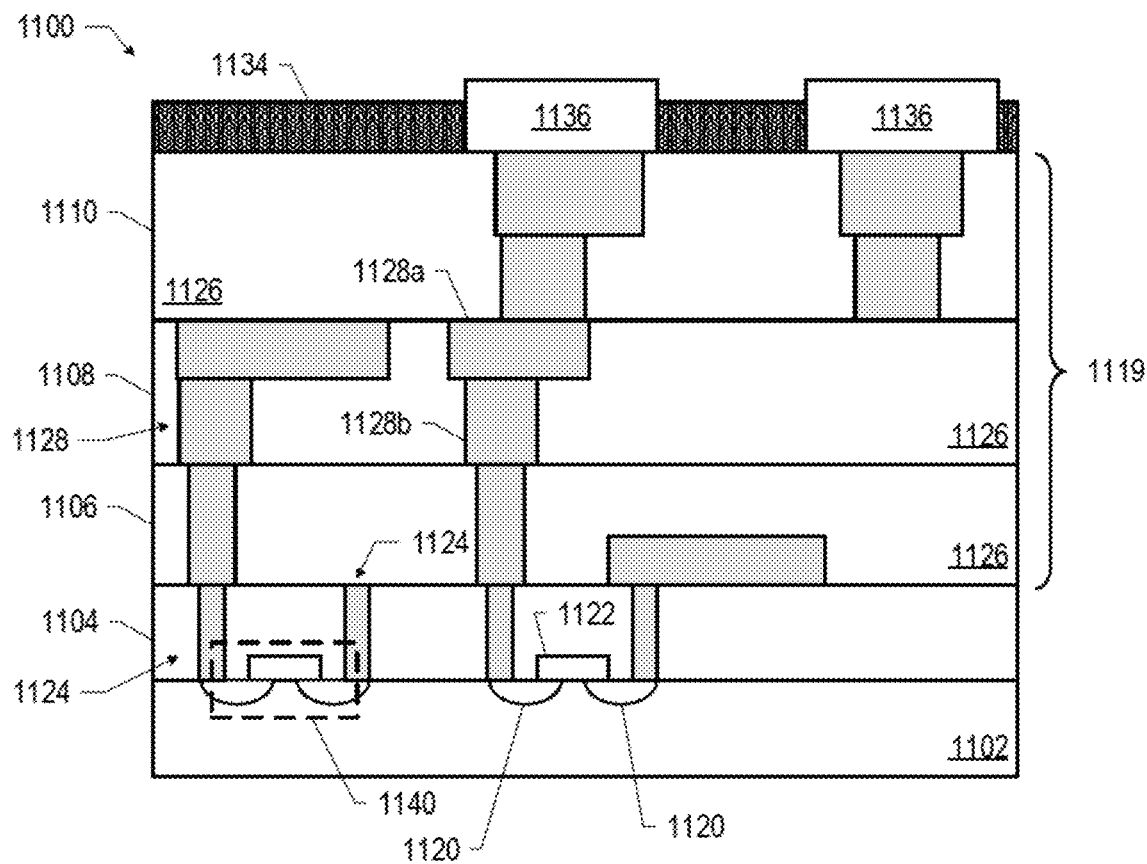
FIG. 7 is a cross-sectional side view of an integrated circuit device that may be included in a microelectronic assembly, in accordance with any of the embodiments disclosed herein.

FIG. 7 is a cross-sectional side view of an example IC device 1100 that may be included in any of the microelectronic assemblies disclosed herein (e.g., in any of the dies 114). One or more of the IC devices 1100 may be included in one or more dies 1002 (FIG. 6). The IC device 1100 may be formed on a substrate 1102 (e.g., the wafer 1000 of FIG. 6) and may be included in a die (e.g., the die 1002 of FIG. 6). The substrate 1102 may be a semiconductor substrate composed of semiconductor material systems including, for example, n-type or p-type materials systems (or a combination of both). The substrate 1102 may include, for example, a crystalline substrate formed using a bulk silicon or a silicon-on-insulator (SOI) substructure. In some embodiments, the substrate 1102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1102. Although a few examples of materials from which the substrate 1102 may be formed are described here, any material that may serve as a foundation for an IC device 1100 may be used. The substrate 1102 may be part of a singulated die (e.g., the dies 1002 of FIG. 6) or a wafer (e.g., the wafer 1000 of FIG. 6).

The IC device 1100 may include one or more device layers 1104 disposed on the substrate 1102. The device layer 1104 may include features of one or more transistors 1140 (e.g., metal oxide semiconductor field-effect transistors (MOSFETs)) formed on the substrate 1102 and/or any other active and/or passive circuitry as may be desired by a device manufacturer. The device layer 1104 may include, for example, one or more source and/or drain (S/D) regions 1120, a gate 1122 to control current flow in the transistors 1140 between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 7 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures.

For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the substrate 1102 adjacent to the gate 1122 of each transistor 1140. The S/D regions 1120 may be formed using an implantation/diffusion process or an etching/deposition process, for example. In the former process, dopants such as boron, aluminum, antimony, phosphorous, or arsenic may be ion-implanted into the substrate 1102 to form the S/D regions 1120. An annealing process that activates the dopants and causes them to diffuse farther into the substrate 1102 may follow the ion-implantation process. In the latter process, the substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 7 as interconnect layers 1106, 1108, and 1110). For example, electrically conductive features of the device layer 1104 (e.g., the gate 1122 and the S/D contacts 1124) may be electrically coupled with interconnect structures 1128 of the interconnect layers 1106-1110. The one or more interconnect layers 1106-1110 may form a metallization stack (also referred to as an "ILD stack") 1119 of the IC device 1100.

The interconnect structures 1128 may be arranged within the interconnect layers 1106-1110 to route electrical signals according to a wide variety of designs. In particular, the arrangement is not limited to the particular configuration of interconnect structures 1128 depicted in FIG. 7. For example, the interconnect structures may be arranged as multidirectional interconnect structures. Although a particular number of interconnect layers 1106-1110 is depicted in FIG. 7, embodiments of the present disclosure include IC devices having more or fewer interconnect layers than depicted.

In some embodiments, the interconnect structures 1128 may include lines 1128a and/or vias 1128b filled with an electrically conductive material such as a metal. The lines 1128a may be arranged to route electrical signals in a direction of a plane that is substantially parallel with a surface of the substrate 1102 upon which the device layer 1104 is formed. For example, the lines 1128a may route electrical signals in a direction in and out of the page from the perspective of FIG. 7. The vias 1128b may be arranged to route electrical signals in a direction of a plane that is substantially perpendicular to the surface of the substrate 1102 upon which the device layer 1104 is formed. In some embodiments, the vias 1128b may electrically couple lines 1128a of different interconnect layers 1106-1110 together.

The interconnect layers 1106-1110 may include a dielectric material 1126 disposed between the interconnect structures 1128, as shown in FIG. 7. In some embodiments, the dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same.

A first interconnect layer 1106 (referred to as Metal 1 or "M1") may be formed directly on the device layer 1104. In some embodiments, the first interconnect layer 1106 may include lines 1128a and/or vias 1128b, as shown. The lines 1128a of the first interconnect layer 1106 may be coupled with contacts (e.g., the S/D contacts 1124) of the device layer 1104.

A second interconnect layer 1108 (referred to as Metal 2 or "M2") may be formed directly on the first interconnect layer 1106. In some embodiments, the second interconnect layer 1108 may include vias 1128b to couple the lines 1128a of the second interconnect layer 1108 with the lines 1128a of the first interconnect layer 1106. Although the lines 1128a and the vias 1128b are structurally delineated with a line within each interconnect layer (e.g., within the second interconnect layer 1108) for the sake of clarity, the lines 1128a and the vias 1128b may be structurally and/or materially contiguous (e.g., simultaneously filled during a dual damascene process) in some embodiments.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the IC device 1100 (i.e., farther away from the device layer 1104) may be thicker.

The IC device 1100 may include a solder resist material 1134 (e.g., polyimide or similar material) and one or more conductive contacts 1136 formed on the interconnect layers 1106-1110. In FIG. 7, the conductive contacts 1136 are illustrated as taking the form of bond pads. The conductive contacts 1136 may be electrically coupled with the interconnect structures 1128 and configured to route the electrical signals of the transistor(s) 1140 to other external devices. For example, solder bonds may be formed on the one or more conductive contacts 1136 to mechanically and/or electrically couple a chip including the IC device 1100 with another component (e.g., a circuit board). The IC device 1100 may include additional or alternate structures to route the electrical signals from the interconnect layers 1106-1110; for example, the conductive contacts 1136 may include other analogous features (e.g., posts) that route the electrical signals to external components.

Figure 8:
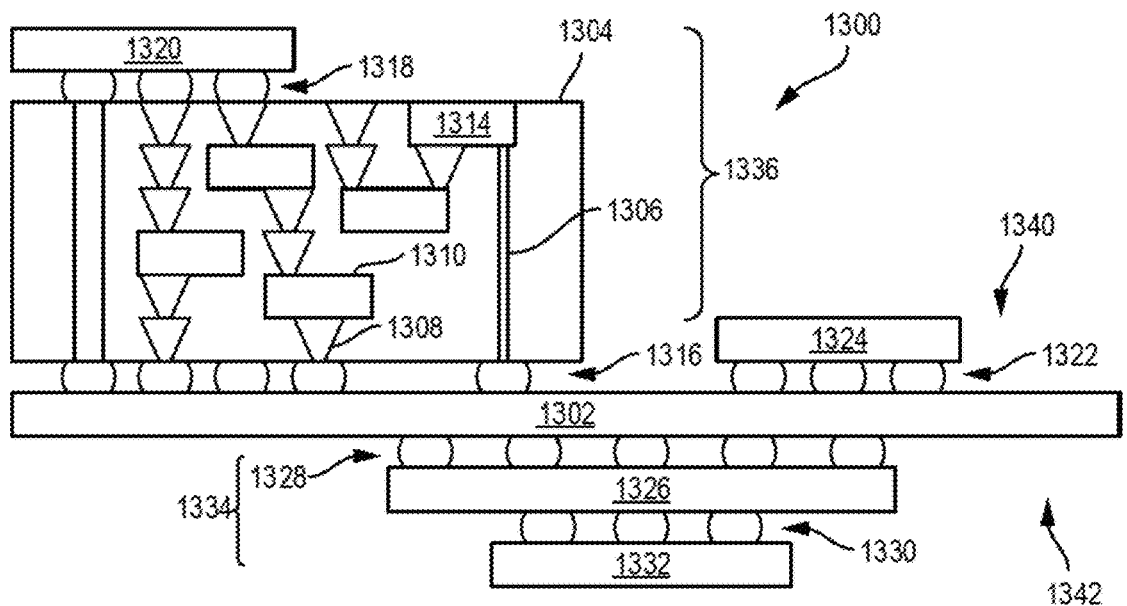
FIG. 8 is a cross-sectional side view of an integrated circuit device assembly that may include a microelectronic assembly, in accordance with any of the embodiments disclosed herein.

In embodiments in which the IC device 1100 is a double-sided die (e.g., like the die 114), the IC device 1100 may include another metallization stack (not shown) on the opposite side of the device layer(s) 1104. This metallization stack may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the IC device 1100 from the conductive contacts 1136. FIG. 8 is a cross-sectional side view of an IC device assembly 1300 that may include any of the microelectronic assemblies disclosed herein. In some embodiments, the IC device assembly 1300 may be a microelectronic assembly 100. The IC device assembly 1300 includes a number of components disposed on a circuit board 1302 (which may be, e.g., a motherboard). The IC device assembly 1300 includes components disposed on a first surface 1340 of the circuit board 1302 and an opposing second surface 1342 of the circuit board 1302; generally, components may be disposed on one or both surfaces 1340 and 1342. Any of the IC packages discussed below with reference to the IC device assembly 1300 may take the form of any suitable ones of the embodiments of the microelectronic assemblies disclosed herein.

In some embodiments, the circuit board 1302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 8 includes a package-on-interposer structure 1336 coupled to the first surface 1340 of the circuit board 1302 by coupling components 1316. The coupling components 1316 may electrically and mechanically couple the package-on-interposer structure 1336 to the circuit board 1302, and may include solder balls (as shown in FIG. 8), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 8, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1002 of FIG. 6), or any other suitable component. Generally, the interposer 1304 may spread a connection to a wider pitch or reroute a connection to a different connection. For example, the interposer 1304 may couple the IC package 1320 (e.g., a die) to a set of ball grid array (BGA) conductive contacts of the coupling components 1316 for coupling to the circuit board 1302. In the embodiment illustrated in FIG. 8, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

In some embodiments, the interposer 1304 may be formed as a PCB, including multiple metal layers separated from one another by layers of dielectric material and interconnected by electrically conductive vias. In some embodiments, the interposer 1304 may be formed of an epoxy resin, a fiberglass-reinforced epoxy resin, an epoxy resin with inorganic fillers, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to TSVs 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first surface 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 8 includes a package-on-package structure 1334 coupled to the second surface 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 9:
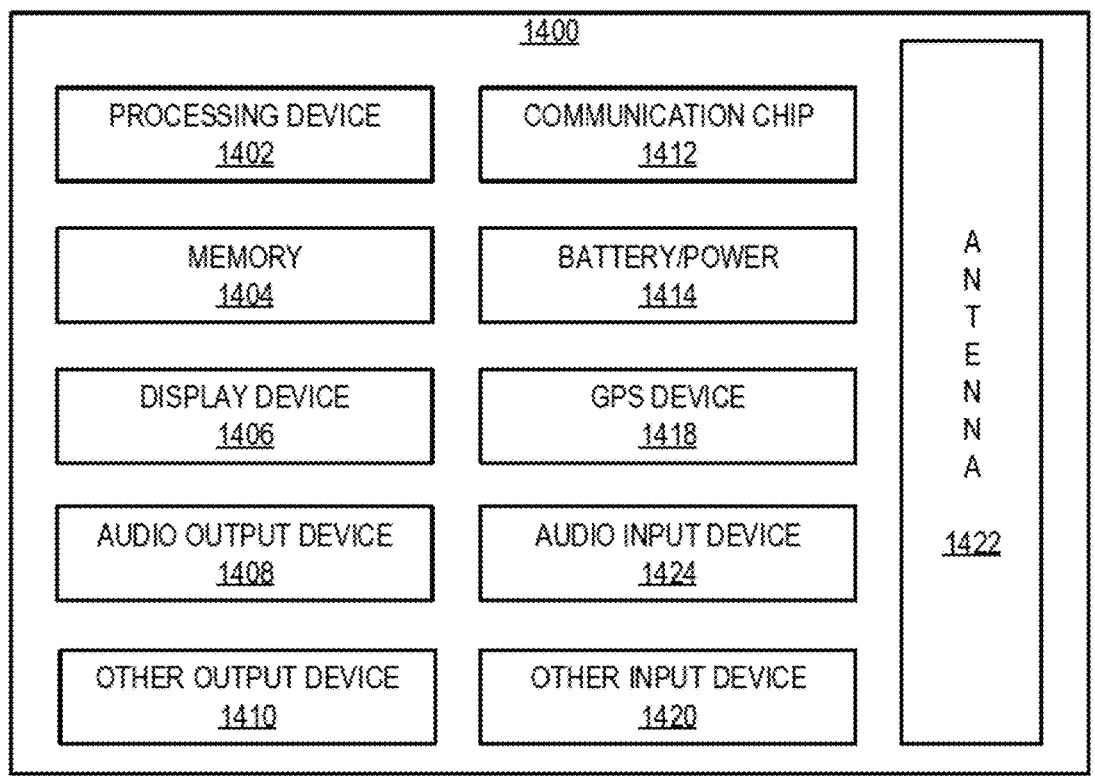
FIG. 9 is a block diagram of an example electrical device that may include a microelectronic assembly, in accordance with any of the embodiments disclosed herein.

FIG. 9 is a block diagram of an example electrical device 1400 that may include one or more of the microelectronic assemblies disclosed herein. For example, any suitable ones of the components of the electrical device 1400 may include one or more of the IC device assemblies 1300, IC devices 1100, or dies 1002 disclosed herein, and may be arranged in any of the microelectronic assemblies disclosed herein. A number of components are illustrated in FIG. 9 as included in the electrical device 1400, but any one or more of these components may be omitted or duplicated, as suitable for the application. In some embodiments, some or all of the components included in the electrical device 1400 may be attached to one or more motherboards. In some embodiments, some or all of these components are fabricated onto a single system-on-a-chip (SoC) die.

Additionally, in various embodiments, the electrical device 1400 may not include one or more of the components illustrated in FIG. 9, but the electrical device 1400 may include interface circuitry for coupling to the one or more components. For example, the electrical device 1400 may not include a display device 1406, but may include display device interface circuitry (e.g., a connector and driver circuitry) to which a display device 1406 may be coupled. In another set of examples, the electrical device 1400 may not include an audio input device 1424 or an audio output device 1408, but may include audio input or output device interface circuitry (e.g., connectors and supporting circuitry) to which an audio input device 1424 or audio output device 1408 may be coupled.

The electrical device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific integrated circuits (ASICs), CPUs, GPUs, cryptoprocessors (specialized processors that execute cryptographic algorithms within hardware), server processors, or any other suitable processing devices. The electrical device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random access memory (STT-MRAM).

In some embodiments, the electrical device 1400 may include a communication chip 1412 (e.g., one or more communication chips). For example, the communication chip 1412 may be configured for managing wireless communications for the transfer of data to and from the electrical device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, and 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The electrical device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as global positioning system (GPS), EDGE, GPRS, CDMA, WiMAX, LTE, EV-DO, or others. In some embodiments, a first communication chip 1412 may be dedicated to wireless communications, and a second communication chip 1412 may be dedicated to wired communications.

The electrical device 1400 may include battery/power circuitry 1414. The battery/power circuitry 1414 may include one or more energy storage devices (e.g., batteries or capacitors) and/or circuitry for coupling components of the electrical device 1400 to an energy source separate from the electrical device 1400 (e.g., AC line power).

The electrical device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display.

The electrical device 1400 may include an audio output device 1408 (or corresponding interface circuitry, as discussed above). The audio output device 1408 may include any device that generates an audible indicator, such as speakers, headsets, or earbuds.

The electrical device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The electrical device 1400 may include a GPS device 1418 (or corresponding interface circuitry, as discussed above). The GPS device 1418 may be in communication with a satellite-based system and may receive a location of the electrical device 1400, as known in the art.

The electrical device 1400 may include another output device 1410 (or corresponding interface circuitry, as discussed above). Examples of the other output device 1410 may include an audio codec, a video codec, a printer, a wired or wireless transmitter for providing information to other devices, or an additional storage device.

The electrical device 1400 may include another input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1400 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1400 may be any other electronic device that processes data.

The following paragraphs provide various examples of the embodiments disclosed herein.

Example 1 is a microelectronic assembly, including: a die having a first surface and an opposing second surface; a capacitor having a surface, wherein the surface of the capacitor is coupled to the first surface of the die; and a conductive pillar having a first end and an opposing second end, wherein the second end of the conductive pillar is coupled to the first surface of the die.

Example 2 may include the subject matter of Example 1, and may further specify that the die is a central processing unit, a radio frequency chip, a power converter, or a network processor.

Example 3 may include the subject matter of Example 1, and may further specify that the die is a first die, and may further include: a second die having a first surface and an opposing second surface, wherein the second surface of the second die is coupled to the first surface of the first die.

Example 4 may include the subject matter of Example 3, and may further specify that the second die is a composite die.

Example 5 may include the subject matter of Example 1, and may further include: a package substrate, wherein the first end of the conductive pillar is coupled to the package substrate.

Example 6 may include the subject matter of Example 5, and may further specify that the conductive pillar is coupled to a power plane or a ground plane in the package substrate.

Example 7 may include the subject matter of Example 1, and may further specify that the capacitor is between 10 squared millimeters and 50 squared millimeters.

Example 8 is a microelectronic assembly, including: a capacitor having a surface in a first dielectric layer; a first die having a first surface and an opposing second surface in the first dielectric layer; and a second die having a first surface and an opposing second surface in a second dielectric layer, wherein the second dielectric layer is on the first dielectric layer, and wherein the first surface of the second die is coupled to the surface of the capacitor and to the second surface of the first die.

Example 9 may include the subject matter of Example 8, and may further include: a conductive pillar in the first dielectric layer, wherein the conductive pillar couples the first surface of the second die to a package substrate.

Example 10 may include the subject matter of Example 9, and may further specify that the conductive pillar is coupled to a power trace or a power plane in the package substrate.

Example 11 may include the subject matter of Example 9, and may further specify that the conductive pillar includes copper.

Example 12 may include the subject matter of Example 8, and may further specify that the capacitor includes: a ceramic capacitor, an electrolytic capacitor, a plastic film capacitor, a tantalum capacitor, a silver mica capacitor, or a super capacitor.

Example 13 may include the subject matter of Example 8, and may further include: a redistribution layer at the first surface of the first die.

Example 14 may include the subject matter of Example 8, and may further include: a redistribution layer at the second surface of the first die.

Example 15 may include the subject matter of Example 8, and may further specify that a footprint of the capacitor is wholly within a footprint of the second die.

Example 16 is a method of manufacturing a microelectronic assembly, including: forming a conductive pillar on a surface of a carrier; placing a capacitor on the surface of the carrier; forming a first dielectric material on the conductive pillar and the capacitor; placing a die on the first dielectric material; forming a first interconnect between the conductive pillar and the die; forming a second interconnect between the capacitor and the die; forming a second dielectric material on the die; and removing the carrier.

Example 17 may include the subject matter of Example 16, and may further specify that forming the conductive pillar includes: depositing and patterning a photoresist material to form an opening; depositing conductive material in the opening; and removing the photoresist material.

Example 18 may include the subject matter of Example 16, and may further specify that the die is a first die, and may further include: placing a second die on the surface of the carrier prior to forming the first dielectric material; and forming a third interconnect between the first die and the second die.

Example 19 may include the subject matter of Example 16, and may further include: forming a redistribution layer between the first dielectric material and the second dielectric material.

Example 20 may include the subject matter of Example 16, and may further specify that a footprint of the capacitor is wholly within a footprint of the die.

Example 21 is a computing device, including: a package substrate having a first surface and an opposing second surface; a first die having a first surface and an opposing second surface in a first dielectric layer, and wherein the first surface of the first die is coupled to the second surface of the package substrate; a capacitor having a surface, wherein the capacitor is in the first dielectric layer; a conductive pillar in the first dielectric layer; and a second die having a first surface and an opposing second surface in a second dielectric layer, wherein the second dielectric layer is on the first dielectric layer, and wherein the first surface of the second die is coupled to the surface of the capacitor, to the second surface of the first die, and to the conductive pillar.

Example 22 may include the subject matter of Example 21, and may further specify that the conductive pillar is coupled to a power plane in the package substrate.

Example 23 may include the subject matter of Example 21, and may further specify that the capacitor includes: a ceramic capacitor, an electrolytic capacitor, a plastic film capacitor, a tantalum capacitor, a silver mica capacitor, or a super capacitor.

Example 24 may include the subject matter of Example 21, and may further include: a redistribution layer between the first dielectric layer and the second dielectric layer.

Example 25 may include the subject matter of Example 21, and may further specify that the second die is a central processing unit, a radio frequency chip, a power converter, or a network processor.

Example 26 may include the subject matter of Example 21, furthering comprising: a circuit board, wherein the first surface of the package substrate is coupled to the circuit board.

Example 27 may include the subject matter of Example 21, and may further specify that the computing device is a server.

Example 28 may include the subject matter of Example 21, and may further specify that the computing device is a portable computing device.

Example 29 may include the subject matter of Example 21, and may further specify that the computing device is a wearable computing device.

Example 30 may include the subject matter of Example 21, and may further specify that the package substrate is a printed circuit board.

The invention claimed is:

1. A microelectronic assembly, comprising:
    a first die having a footprint;
    a second die having a footprint, the second die laterally spaced apart from the first die;
    a third die beneath the first die and the second die, the third die having a first sidewall and a second sidewall opposite the first sidewall, the third die having a footprint, wherein the footprint of the first die partially overlaps with the footprint of the third die, and the footprint of the second die partially overlaps with the footprint of the third die, and the third die having through silicon vias;
    a first conductive pillar laterally spaced apart from the first sidewall of the third die;
    a second conductive pillar laterally spaced apart from the second sidewall of the third die;
    a first capacitor spaced apart from the first sidewall of the third die, the first capacitor having a footprint within the footprint of the first die; and
    a second capacitor spaced apart from the second sidewall of the third die, the second capacitor having a footprint within the footprint of the second die.

2. The microelectronic assembly of claim 1, wherein the first capacitor is at a same level as the third die, and wherein the second capacitor is at a same level as the third die.

3. The microelectronic assembly of claim 1, wherein only a top side of the first capacitor has electrical connections thereon, and only a top side of the second capacitor has electrical connections thereon.

4. The microelectronic assembly of claim 3, wherein the electrical connections on the top side of the first capacitor are coupled directly to the first die, and the electrical connections on the top side of the second capacitor are coupled directly to the second die.

5. The microelectronic assembly of claim 1, further comprising:
    a package substrate beneath the first capacitor, the third die, and the second capacitor.

6. The microelectronic assembly of claim 5, wherein the package substrate is coupled to the third die by interconnects.

7. The microelectronic assembly of claim 1, wherein an uppermost surface of the first die is at a same level as an uppermost surface of the second die.

8. The microelectronic assembly of claim 1, wherein a bottommost surface of the first die is at a same level as a bottommost surface of the second die.

9. The microelectronic assembly of claim 1, wherein an uppermost surface of the first die is at a same level as an uppermost surface of the second die, and wherein a bottommost surface of the first die is at a same level as a bottommost surface of the second die.

10. The microelectronic assembly of claim 1, further comprising:
    a fourth die laterally between the first die and the second die.

11. The microelectronic assembly of claim 1, wherein the first capacitor is laterally spaced apart from the first conductive pillar, and the second capacitor is laterally spaced apart from the second conductive pillar.

12. The microelectronic assembly of claim 1, further comprising:
    an insulating material in contact with the first sidewall of the third die, and in contact with the second sidewall of the third die.

13. A microelectronic assembly, comprising:
    a first die having a lateral width;
    a second die having a lateral width, the second die at a same level as the first die;
    a third die beneath the first die and the second die, the third die having a lateral width, wherein the lateral width of the third die is partially within the lateral width of the first die, and the lateral width of the third die is partially within the lateral width of the second die, and the third die having a silicon substrate with conductive vias extending there through;
    a first conductive structure laterally adjacent to a first side of the third die;
    a second conductive structure laterally adjacent to a second side of the third die, the second side laterally opposite the first side;
    a first capacitor spaced apart from the first side of the third die, the first capacitor having a lateral width entirely within the lateral width of the first die; and
    a second capacitor spaced apart from the second side of the third die, the second capacitor having a lateral width entirely within the lateral width of the second die.

14. The microelectronic assembly of claim 13, wherein the third die is at a same level as the first capacitor and the second capacitor, the first conductive structure is between the first capacitor and the third die, and the second conductive structure is between the second capacitor and the third die.

15. The microelectronic assembly of claim 13, wherein an uppermost surface of the first die is at a same level as an uppermost surface of the second die, and wherein a bottommost surface of the first die is at a same level as a bottommost surface of the second die.

16. The microelectronic assembly of claim 13, further comprising:
    an insulating material, wherein the third die is in the insulating material.

17. The microelectronic assembly of claim 13, further comprising:
    a fourth die at a same level as the first die and the second die, the fourth die coupled to the third die.

18. A microelectronic assembly, comprising:
    a first die;
    a second die laterally spaced apart from the first die;
    a third die beneath the first die and the second die, the third die having a first sidewall and a second sidewall opposite the first sidewall, wherein the first die partially vertically overlaps the third die, and the second die partially vertically overlaps the third die, and the third die having a silicon substrate with one or more conductive vias extending through the silicon substrate;

a first conductive pillar laterally spaced apart from the first sidewall of the third die;

a second conductive pillar laterally spaced apart from the second sidewall of the third die;

a first capacitor spaced apart from the first sidewall of the third die, wherein the first die completely vertically overlaps the first capacitor; and a second capacitor spaced apart from the second sidewall of the third die, wherein the second die completely vertically overlaps the second capacitor.

19. The microelectronic assembly of claim 18, wherein an uppermost surface of the first die is at a same level as an uppermost surface of the second die, and wherein a bottommost surface of the first die is at a same level as a bottommost surface of the second die.

20. The microelectronic assembly of claim 18, further comprising:

a substrate beneath the first capacitor, the third die, and the second capacitor.

* * * * *